United States Patent
Hayashi

(10) Patent No.: US 7,269,192 B2
(45) Date of Patent: Sep. 11, 2007

(54) OPTICAL TRANSMITTING MODULE AND A METHOD FOR CONTROLLING THE SAME

(75) Inventor: Shigeo Hayashi, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 181 days.

(21) Appl. No.: 10/761,427

(22) Filed: Jan. 22, 2004

(65) Prior Publication Data

US 2004/0179778 A1  Sep. 16, 2004

(30) Foreign Application Priority Data

Jan. 23, 2003 (JP) ............................ 2003-015313

(51) Int. Cl.
*H01S 3/04* (2006.01)
(52) U.S. Cl. ................... 372/34; 372/38.02; 372/38.07
(58) Field of Classification Search ................. 372/34, 372/38.02, 38.07
See application file for complete search history.

(56) References Cited

U.S. PATENT DOCUMENTS

| 4,730,112 A | * | 3/1988 | Wong ......................... 250/343 |
| 5,019,769 A | | 5/1991 | Levinson |
| 2003/0081289 A1 | | 5/2003 | Oomori et al. |
| 2004/0004980 A1 | * | 1/2004 | Mazed ......................... 372/32 |

* cited by examiner

*Primary Examiner*—Dung Nguyen
(74) *Attorney, Agent, or Firm*—McDermott Will & Emery LLP

(57) ABSTRACT

The present invention provides a semiconductor laser module that reduces a shift of the output wavelength after the laser diode is practically operated. The laser module comprises the semiconductor laser, a thermistor, a thermoelectric cooler, a heater and a controller. When the temperature of the laser diode is out of a preset range, the heater is supplied a current for simulating the self-heating of the laser diode. After the temperature of the laser diode falls within the preset range, the current supplied to the heater is shut off and the laser diode is practically driven by providing the bias and the modulation currents thereto.

5 Claims, 3 Drawing Sheets

OPTICAL TRANSMITTING MODULE AND A METHOD FOR CONTROLLING THE SAME

BACKGROUND OF THE INVENTION

1. Field of the Invention

This invention relates to an optical transmitting module and a method for controlling an output wavelength of the optical transmitting module.

2. Related Prior Art

In a Wavelength Division Multiplex (hereinafter denoted as WDM) communication system, various technique have been well known to maintain an output wavelength of a light source such as a semiconductor laser diode. One example of such techniques is to use a thermoelectric cooler. A temperature of the laser diode disposed on the thermoelectric cooler with a sensor for monitoring a temperature of the laser diode, and the laser diode is so controlled via the thermoelectric cooler that the temperature is kept constant based on the result of the sensing. This technique utilizes a characteristic that the output wavelength of the laser diode has temperature dependence.

In the conventional optical source using the laser diode for the WDM communication system, the temperature of the laser diode must be set to be within a predetermined range at a first step of the operation to prevent the laser diode from oscillating at an optional wavelength. Next, a bias current and a modulation current are provided to the laser diode. In such sequential steps, the temperature of the laser diode may rise due to self-heating by currents provided thereto, which shifts the output wavelength out of the predetermined range. Getting out of the range in the output wavelength, the currents provided to the laser diode are ceased, which restores the temperature of the laser diode. Afterward, turning on and shutting down the bias current are iterated.

SUMMARY OF THE INVENTION

An object of the present invention is to provide a semiconductor laser module having a thermally stabilized operating characteristic, and a method for thermally stabilizing the laser module.

According to one aspect of the present invention, an optical assembly comprises a laser diode, a temperature sensor, a heater and a thermoelectric cooler. The laser diode emits light within a predetermined wavelength range at a temperature by providing a driving signal thereto. The temperature sensor senses the temperature of the laser diode. The heater simulates a self-heating of the laser diode by providing a supply current before the driving signal is applied to the laser diode. The self-heating occurs when the laser diode is driven by the driving signal. The thermoelectric cooler mounts the laser diode, the temperature sensor and the heater thereon, and controls the temperature of the laser diode.

Since the heater is disposed on the thermoelectric cooler and provided the supply current before the laser diode is practically driven, the self-heating is simulated by the heater and the thermal condition of the optical assembly is unchanged before and after the laser diode is practically driven. This accelerates to stabilize the output wavelength of the laser diode.

Another aspect of the present invention concerns with a semiconductor laser module that comprises an aforementioned optical assembly and a controller. The controller includes a window comparator and a first switch. The window comparator compares the temperature of the laser diode sensed by the temperature sensor and a predetermined range, and outputs a switching signal when the temperature of the laser diode falls within the predetermined range. The first switch is connected to the heater and has a normally closed configuration. The first switch turns off, when it receives the switching signal output from the window comparator, thereby shutting off the supply current provided to the heater.

The semiconductor laser module may further include a second and a third switches. The driving signal provided to the laser diode, includes a modulation current and a bias current. Receiving the switching signal output from the window comparator, the second switch turns on and supplies the bias current to the laser diode, and the third switch also turns on and supplies the modulation current to the laser diode.

The semiconductor laser module may include a memory means and a digital-to-analog converter. The memory means preserves the predetermined range in a digital form, and the digital-to-analog converter converts the predetermined range in the digital form to a corresponding analog form, and outputs the converted predetermined value to the window comparator.

Since the predetermined range is digitally processed, which defines the starting temperature for the laser module to operate, the degree of freedom and the simplicity fair setting the predetermined range may be enhanced.

The semiconductor laser module concerning to the present aspect may further include a driver for the thermoelectric cooler and a differential amplifier. The differential amplifier compares the temperature of the laser diode sensed by the temperature sensor and a preset temperature. The differential amplifier outputs a result of the comparison to the driver for the thermoelectric cooler, so that a feedback control for stabilizing the temperature of the laser diode is achieved.

Still further aspect of the present invention relates to a method for thermally stabilizing the aforementioned optical assembly. The method comprises steps of (a) providing the supply current to the heater for simulating the self heating of the laser diode, (b) shutting off the supply current after the temperature of the laser diode falls within the predetermined range, and (c) providing the driving signal to the laser diode.

Since the heater is heated by the supply current before the laser diode is practically driven, the self-heating may be simulated by the heater and the thermal condition of the region on the thermoelectric cooler is unchanged before and after the laser diode is driven. This accelerates to stabilize the output wavelength of the laser diode.

DETAILED DESCRIPTION OF PREFERRED EMBODIMENTS

The present invention may be understood from the detailed description presented hereinbelow as referring to accompanying drawings. Next, preferred embodiments of the present invention will be described. In the specification, the same elements will be referred to by the same symbols and the numerals without overlapping explanation.

First Embodiment

Figure 1:
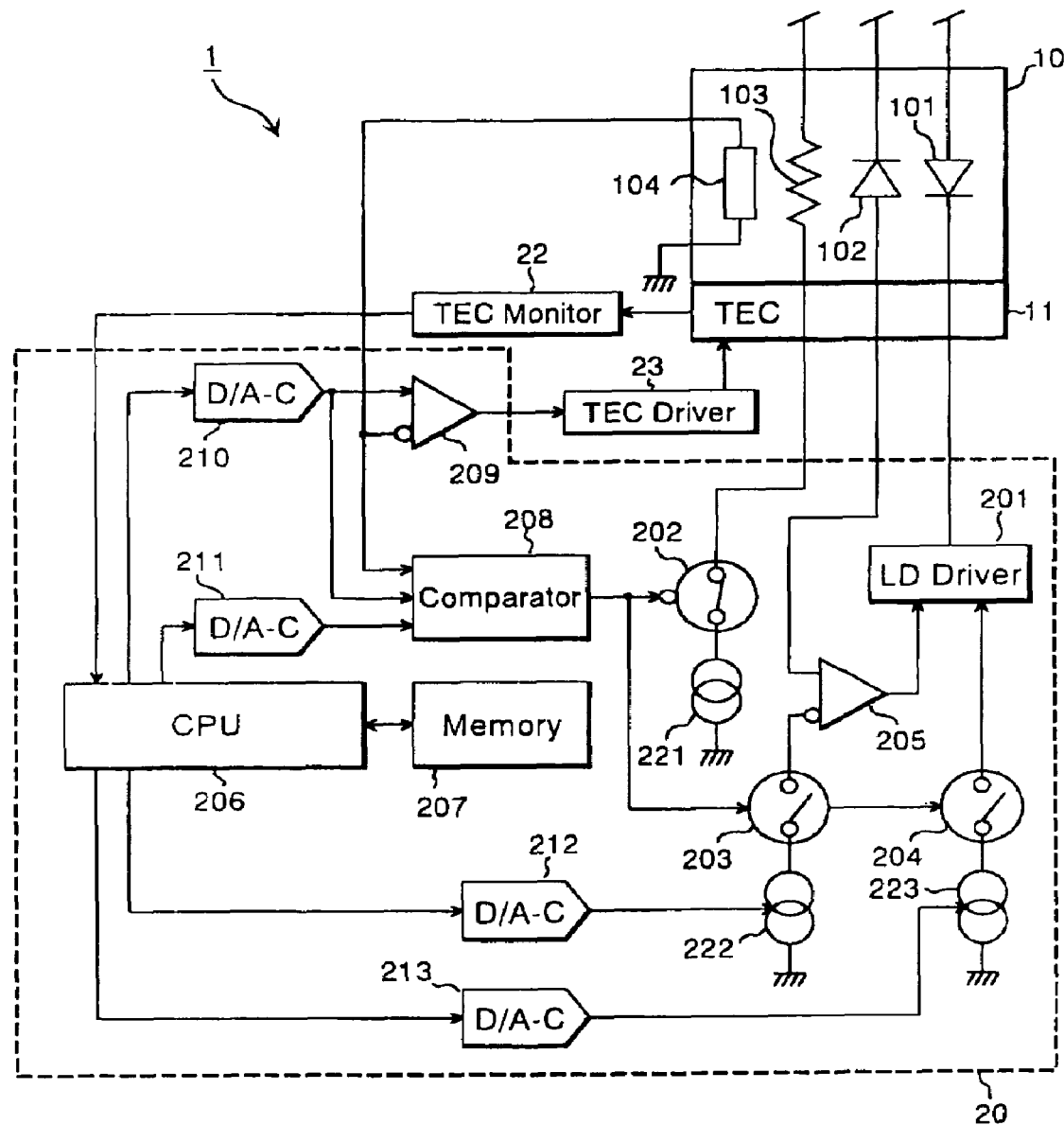
FIG. 1 is a block diagram showing the semiconductor laser module according to the first embodiment of the present invention.

FIG. 1 is a block diagram of a semiconductor laser module according to the present invention. The semiconductor laser module 1 comprises an optical assembly 10, at controller 20, a monitor for a thermoelectric cooler (hereinafter denoted as TEC) 22, and a TEC driver 23. A Peltier element may be used as the TEC.

The optical assembly 10 provides a laser diode 101, a photodiode 102, a heater 103 and a thermistor 104. The photodiode 102 monitors an optical output power of the laser diode, while thermistor 104 monitors a temperature of a region where the laser diode is installed. A temperature of the optical assembly 10 is controlled by the TEC 11. The TEC is driven by the TEC driver 23 and its condition, such as a supply current, is monitored by the TEC monitor 23 for prevent the TEC from being out of control.

Next, a configuration and an operation of the controller 20 will be described the controller 20 provides a driver for the laser diode (hereinafter denoted as LD-driver) 201, a plural transistors 202 to 204, two differential amplifiers 205 and 209, a central-processing-unit (CPU) 206, a memory means 207, a window comparator 208 and a plural digital-to-analog converters (D/A-C) 210 to 213.

An external data involving information relating to a monitored temperature of the optical assembly generated by the thermistor is transmitted to the differential amplifier 209 and the comparator 208. One of inputs of the differential amplifier 209 is provided a first reference data relating to the predetermined temperature of the optical assembly 10 from the CPU 206 via the D/A-C 210. The predetermined temperature corresponds to the center value of the temperature range permissible for the laser diode to oscillate at the wavelength specified by the WDM system. The CPU 206 generates the first reference data based on information stored in the memory means 207. The differential amplifier 209 provides a driving-signal to the TEC driver 23 for driving the TEC 11.

The comparator 208 receives the external data provided form the thermistor, the first reference data and a second reference data relating to the temperature of the optical assembly 10 from the CPU 206 via the D/A-C 211. The first reference data, as described previously, corresponds to the center value of the predetermined temperature range, while the second reference data is a half width of the range. The comparator decides whether the external data is within the first reference data +/− the second reference data, and outputs switching signals for the transistors from 202 to 204, when the external data is within the predetermined range, which Beans that the temperature of the optical assembly 10 is within the range permissible to emit light with a specific wavelength.

The transistor 202 switches a supply current to the heater 103. When the comparator 208 does not supply the switching signal to the transistor 202, the current is supplied to the heater 103. Providing the switching signal from the comparator 208, which corresponds to the case that the temperature of the optical assembly is within the predetermined range, the supply current to the heater is shut down. Namely, the transistor 202 functions as a normally close switch.

Transistors 203 and 204, when the comparator 208 output the switching signal transmit currents generated by respective current source 221 and 223, each controlled by the D/A-C 212 and D/A-213, to the differential amplifier 205 and the LD-driver 201. Namely, these transistors 202 and 203 work as a normally open switch opposite to the operation of the transistor 201. When the external data, which indicates the sensed temperature of the optical assembly, is within the first reference data +/− the second reference data, the LD-driver 201 starts to drive the laser diode 101.

Figure 2:
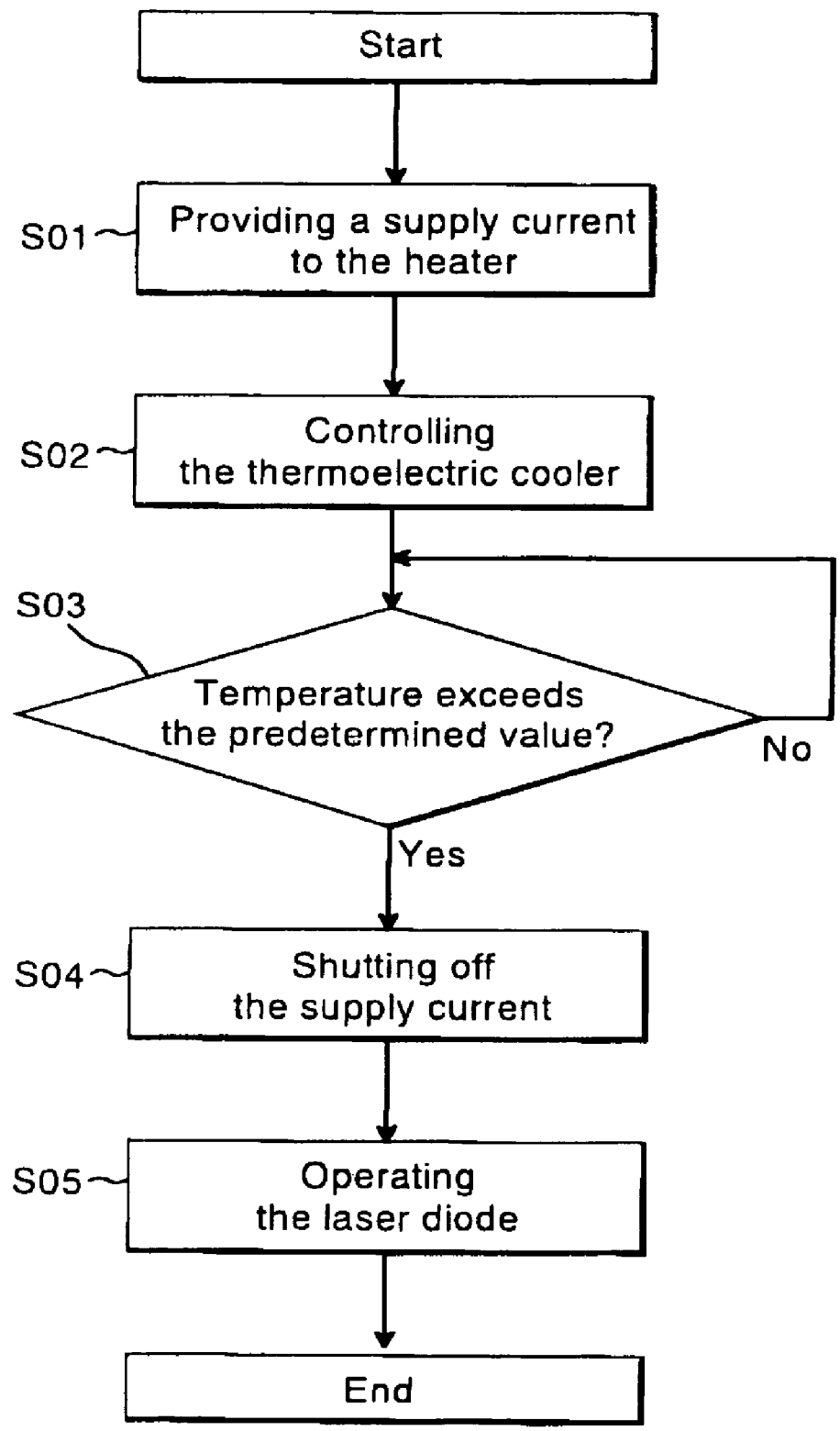
FIG. 2 is a flow chart showing the method for controlling the semiconductor laser module of the present invention.

Next, an operation of the semiconductor laser module 1 will be described. FIG. 2 shows a flow chart to explain operational steps of the laser module 1. When a power supply of the laser module 1 puts on, the comparator 208 does not output the switching signal to the transistor 202 because the temperature of the optical assembly, which is detected by the thermistor 104, is below the lower limit. The lower limit corresponds to the value of the first reference data—the second reference data. Since the transistor 202 is a normally close switch, the current is supplied to the heater 103. In the case that the performance of the heater 103, especially the heat-generating characteristic thereof, is set to those similar to the laser diode 101 under consideration, a thermal condition of the optical assembly 10 may be simulated as the normal operating condition of the semiconductor laser module 1 when the laser diode is driven. On the other hand, the TEC driver 23 may drive the TEC 11 independently on the heater 103, thereby bringing the temperature of the optical assembly 10 close to or within the predetermined range (step S01). The driving signal based on the first reference data provided from the CPU 206 and the external data sensed by the thermistor 104 is output to the TEC driver 23. The TEC driver 23 feedback controls the TEC 11 by the driving signal so as to stabilize the temperature of the optical assembly 10 close to the temperature corresponding to the first reference data (step S02).

The window comparator 208 compares the external data, which corresponds to the temperature of the optical assembly, and the first and the second reference data at step S03. When the external data falls within the range of the first reference data +/− the second reference data, the window comparator 208 outputs the switching signal to the transistor 202, which shut down the supply current; to the heater 103 (step S04).

Simultaneously the window comparator 208 outputs the switching signal to the transistors 203 and 204, which turns on the transistors 203 and 204. Accordingly, the currents 222 and 223 controlled by the CPU 206 via the D/A-Cs 212 and 213 may be transmitted to the LD driver, and the differential amplifier 205, thereby starting to drive the laser diode (step S05). The thermal condition of the optical assembly may be maintained, because merely a heat source changes from the heater 103 to the laser diode 101 but the calorific value thereof dose not varied at step 05. Therefore, the influence of the self-heating of the laser diode 101 may be suppressed, which results on the immutable condition of the TEC 11 and the thermally stable condition of the optical assembly 10.

Second Embodiment

Figure 3A:
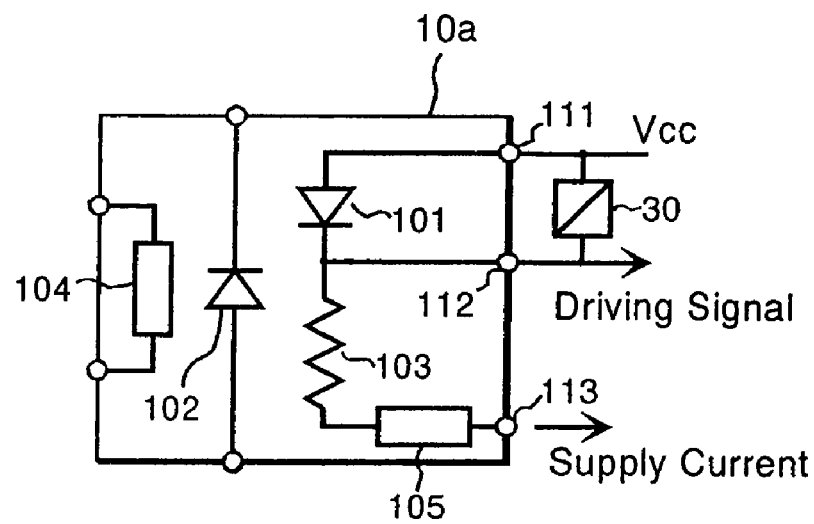
FIG. 3 is a modified optical assembly involved in the semiconductor laser module of the present invention.
Figure 3B:
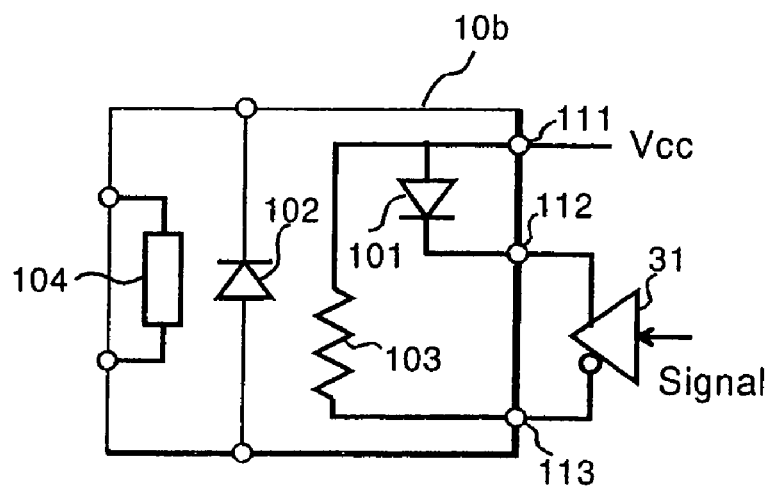

Next, the modified optical assembly 10 will be described. FIG. 3A and. FIG. 3B show modified optical assemblies 10a and 10b of the present invention, respectively. The optical assembly 10a shown in FIG. 3A provides the laser diode 101, the photodiode 102, the heater 103, the thermistor and the inductor 105. Out of the optical assembly has a switch 30, and the inductor 105 is serially arranged to the heater 103. When the optical assembly 10a is operated, during the transistor 202 shown in FIG. 1 turns on, that is the temperature of the optical assembly 10a is out of the preset range, and the switch 30 is closed, which bypasses the supply current from the laser diode 101. The supply current to the heater 103 flows through the terminal 113. After the temperature of the optical assembly 10a fails within the preset range and the transistor 202 turns off, which shuts down the supply current flowing through the terminal 103, the switch 30 is simultaneousy opened. In the present embodiment, the driving signal of the laser diode is transmitted through the terminal 112. The terminal 111 supplies the bias voltage to the laser diode 101. Since the inductor 105 is arranged serially to the heater 103, the driving signal, which is provided from the terminal 112 and involves high frequency components therein, is not conducted to the terminal 113.

Third Embodiment

FIG. 3B shows still another modified arrangement of an optical assembly 10b according to the present invention. The optical assembly 10b provides the laser diode, the photo diode 102, the heater 103 and the thermistor 104. An amplifier 31 having a differential output is arranged out of the optical assembly 10b and the amplifier 31 drives the optical assembly 10b. An anti-phase output of the amplifier 31 is conducted to the terminal 113, which is connected to the one terminal of the heater 103. During the temperature of the optical assembly 10b is out of the preset range, the amplifier 31 receives a signal with a high level and the anti-phase output thereof is set to be a low level. Therefore, the supply current flows from the terminal 111 to the terminal 113 through the heater 103. When the temperature of the optical assembly 10b falls within the preset range, the input signal to the amplifier 31 changes to the practical driving signal of the laser diode, which involves high-frequency components. The signal input to the amplifier 31 drives not only the laser diode 101 but also the heater 103. However, the total amount of the heat generation by the laser diode and the heater is unvaried because the power consumption by the driving signal, which is an alternating signal, is nearly half when the heater is driven by a direct current.

What is claimed is:

1. A semiconductor laser module, comprising:
 (a) an optical assembly including,
 a laser diode for emitting light within a predetermined wavelength range at a temperature by providing a driving signal thereto,
 a temperature sensor for sensing said temperature of said laser diode,
 a heater for simulating a self-heating of said laser diode by providing a supply current, and
 a thermoelectric cooler for controlling said temperature of said laser diode, said thermoelectric cooler mounting said semiconductor laser diode, said temperature sensor and said heater thereon; and
 (b) a controller including,
 a memory means for preserving a predetermined temperature range in a digital form,
 a digital to analog converter for converting said predetermined temperature range preserved in said memory means to values in an analog form and for outputting, to said window comparator, said values converted from said digital form,
 a window comparator for comparing said temperature of said laser diode sensed by said temperature sensor with said values, said window comparator outputting a switching signal when said temperature of said laser diode falls within said predetermined range, and a first switch connected to said heater, said first switch having a normally close configuration and turning off by receiving said switching signal from said window comparator, thereby shutting off said supply current to said heater.

2. The semiconductor laser module according to claim 1, wherein said driving signal includes a bias current and a modulation current, and said semiconductor laser module further comprises a second switch and a third switch, said second switch turning on and supplying said bias current to said laser diode by receiving said switching signal, and said third switch turning on and supplying said modulation current to said laser diode by receiving said switching signal.

3. The semiconductor laser module according to claim 1, further comprising a driver for driving said thermoelectric cooler and a differential amplifier,
 wherein said differential amplifier compares said temperature of said laser diode sensed by said temperature sensor and a predetermined temperature, and outputs a signal for driving said thermoelectric cooler so as to stabilize said temperature of said laser diode at said predetermined temperature.

4. A method for thermally stabilizing an optical assembly including a semiconductor laser diode, a temperature sensor, a heater and a thermoelectric cooler, said laser diode emitting light within a predetermined wavelength range at a temperature by providing a driving signal thereto, said temperature sensor sensing said temperature of said laser diode, said thermoelectric cooler controlling said temperature of said laser diode and mounting said laser diode, said temperature sensor and said heater thereon, said method comprising the steps of:
 converting, by a digital to analog converter, a temperature range preserved in a memory means in a digital form into value in an analog form;
 providing a supply current to said heater for simulating a self-heating of said laser diode;
 comparing, by a window comparator, said temperature of said laser diode with said values converted by said digital to analog converter;
 outputting, by said window comparator, a switching signal to a switch when said temperature of said laser diode falls within said temperature range;
 shutting off said supply current by turning off said switch with said switching signal; and
 providing said driving signal to said laser diode.

5. An optical assembly, comprising:
 a laser diode for emitting light within a predetermined wavelength range at a temperature by providing a driving signal thereto;
 a temperature sensor for sensing said temperature of said laser diode;
 a heater for simulating a self-heating of said laser diode by providing a supply current before said driving signal is provided to said laser diode;
 a thermoelectric cooler for controlling said temperature of said laser diode, said thermoelectric cooler mounting said laser diode, said temperature sensor and said heater thereon;
 an inductor connected in serial to said heater; and
 first to third terminals, said first and second terminals arranging said laser diode therebetween and said first and third terminals arranging said serially connected heater and inductor therebetween,
 wherein said driving signal is provided to said second terminal, and said supply current is provided from said third terminal.

* * * * *